(12) United States Patent
Rumer et al.

(10) Patent No.: US 9,938,616 B2
(45) Date of Patent: Apr. 10, 2018

(54) PHYSICAL VAPOR DEPOSITION OF LOW-STRESS NITROGEN-DOPED TUNGSTEN FILMS

(71) Applicant: Lam Research Corporation, Fremont, CA (US)

(72) Inventors: Michael Rumer, Santa Clara, CA (US); Michael Ng, Dublin, CA (US)

(73) Assignee: Lam Research Corporation, Fremont, CA (US)

( * ) Notice: Subject to any disclaimer, the term of this patent is extended or adjusted under 35 U.S.C. 154(b) by 178 days.

(21) Appl. No.: 14/445,911

(22) Filed: Jul. 29, 2014

(65) Prior Publication Data

US 2016/0035569 A1 Feb. 4, 2016

(51) Int. Cl.
*C23C 14/00* (2006.01)
*C23C 14/06* (2006.01)
(Continued)

(52) U.S. Cl.
CPC ...... *C23C 14/0084* (2013.01); *C23C 14/0036* (2013.01); *C23C 14/0641* (2013.01);
(Continued)

(58) Field of Classification Search
CPC ............ C23C 14/0688; C23C 14/0036; C23C 14/185; C23C 14/0641; C23C 14/0084; H01J 37/3408; H01J 37/3426; H01L 21/0337; H01L 21/0332; H01L 21/0271; H01L 21/31144; H01L 21/32051; H01L 27/11556; H01L 27/11582
See application file for complete search history.

(56) References Cited

U.S. PATENT DOCUMENTS 5,773,177 A * 6/1998 Ikeda ................. G03F 1/22
378/34
2004/0214417 A1* 10/2004 Rich ................. C23C 14/165
438/592

FOREIGN PATENT DOCUMENTS

JP   62130567 A * 6/1987
JP   03255624 A * 11/1991
(Continued)

OTHER PUBLICATIONS

Machine Translation KR2011060738A.*
(Continued)

*Primary Examiner* — Michael A Band
(74) *Attorney, Agent, or Firm* — Weaver Austin Villeneuve & Sampson LLP

(57) ABSTRACT

Nitrogen-doped tungsten films characterized by low stress (e.g. less than 250 MPa) and excellent adhesion to an underlying dielectric layer are deposited by physical vapor deposition (PVD). The films can be used as hardmask layers in fabrication of 3D memory stacks and can be deposited directly onto a top dielectric layer in a stack of layers. The low stress films are characterized by higher concentration of nitrogen at the interface with the dielectric layer than in the bulk of the film, and have a nitrogen content of between about 5-20% atomic. The films having a thickness of between about 300-900 nm can be deposited in a PVD process chamber by forming a plasma in a process gas comprising a noble gas and nitrogen, where the flow rate of nitrogen is between about 10-17% of the total flow rate of the process gas.

15 Claims, 11 Drawing Sheets

(51) Int. Cl.
*C23C 14/18* (2006.01)
*H01J 37/34* (2006.01)
*H01L 21/311* (2006.01)
*H01L 21/3205* (2006.01)
*H01L 27/11556* (2017.01)
*H01L 27/11582* (2017.01)

(52) U.S. Cl.
CPC ........ *C23C 14/0688* (2013.01); *C23C 14/185* (2013.01); *H01J 37/3408* (2013.01); *H01J 37/3426* (2013.01); *H01L 21/31144* (2013.01); *H01L 21/32051* (2013.01); *H01L 27/11556* (2013.01); *H01L 27/11582* (2013.01)

(56) References Cited

FOREIGN PATENT DOCUMENTS

JP   2005123576 A  *  5/2005
KR   2011060738 A  *  6/2011

OTHER PUBLICATIONS

Machine Translation JP2005123576A.*
Shen, Y.G. et al., Composition, residual stress, and structural properties of thin tungsten nitride films deposited by reactive magnetron sputtering, Journal of Applied Physics, vol. 88, No. 3, Aug. 1, 2000, pp. 1380-1388.

* cited by examiner

PHYSICAL VAPOR DEPOSITION OF LOW-STRESS NITROGEN-DOPED TUNGSTEN FILMS

FIELD OF THE INVENTION

The present invention pertains to methods of depositing low stress tungsten films on semiconductor substrates by physical vapor deposition (PVD). The methods are particularly promising for depositing tungsten hardmasks during fabrication of 3D memory devices

BACKGROUND OF THE INVENTION

Fabrication of three dimensional (3D) memory devices (e.g., 3D NAND memory) involves patterning of stacks of dielectric layers, where one individual stack may include more than ten, twenty or even fifty layers. Patterning of such stacks on a semiconductor substrate is often performed by depositing a relatively thick hardmask layer over the top layer of the stack, patterning the hardmask to expose the underlying layer in a desired pattern, and etching the exposed underlying layer while not fully removing the hardmask.

The hardmask material should have an excellent etch selectivity versus the etched dielectric, it should have a good adhesion to the underlying dielectric layer and, importantly, it should not cause substantial substrate bowing due to stress. Two types of stresses contribute to deformation of the substrate—compressive stress and tensile stress. When the hardmask material is compressive (i.e., has compressive stress), the hardmask pushes onto the substrate and bows the substrate downward. When the hardmask material is tensile (i.e., has tensile stress), the hardmask pulls the substrate upward. Typically the absolute value of the substrate bowing increases with the increasing thickness of the hardmask. Therefore, in applications where thick hardmasks are needed, the stress of the hardmask materials should be particularly low in order to minimize the substrate bow. In some applications moderate stress may be desired to compensate for the existing stress of the stack.

In conventional processing carbon is often used as a hardmask material for patterning of the 3D memory stacks. However, thick carbon films can cause undesirably large stress-induced substrate bowing. New materials with lower stress and high etch selectivity are needed for hardmask applications.

SUMMARY OF THE INVENTION

Tungsten is a promising material that can be used in semiconductor device processing, particularly as a hardmask in 3D memory fabrication. However, pure PVD-deposited tungsten has a stress that is not acceptable for many hardmask applications and exhibits relatively low adhesion to dielectric layers when tungsten film thickness exceeds ~400-500 nm, which limits its use in applications that require deposition of relatively thick layers. Embodiments described herein provide an unexpectedly discovered nitrogen-doped tungsten film that has an unusually low stress (e.g., less than about 250 MPa) and good adhesion to dielectric. The film may be deposited, in some embodiments, onto a dielectric layer in a single PVD process chamber without depositing an intermediate adhesion layer in a different chamber.

In one aspect, a method for depositing low-stress tungsten is provided. The method includes: (a) providing a semiconductor substrate comprising a stack of layers and having an exposed layer of a dielectric material on its surface; and (b) depositing a layer of nitrogen-doped tungsten having a thickness of at least 300 nm onto the layer of dielectric material by physical vapor deposition (PVD), wherein the deposited layer has a higher nitrogen content at the interface with the layer of dielectric material than elsewhere in the deposited layer, and wherein the nitrogen content in the deposited layer is between about 5-20 atomic %. For example, in some embodiments the nitrogen content in the deposited layer is between about 5-15% atomic. In one embodiment nitrogen concentration at the interface with the dielectric layer is between about 11-13% atomic, while the nitrogen concentration in the bulk of the layer is between about 6-9% atomic. Generally, methods provided herein can be used to deposit low-stress layers of a variety of thicknesses but are particularly advantageous for deposition of layers with thicknesses of at least about 300 nm.

In some embodiments, the formed film has a thickness of at least about 400 nm, or at least about 500 nm, such as between about 700-900 nm, and has a stress of less than about 250 MPa, such as less than about 200 MPa in absolute value. The low-stress films provided herein are deposited on the substrate, in some embodiments such that the bow of the substrate after deposition is less than about 150 μm, preferably such as less than about 50 μm.

The deposited nitrogen-doped tungsten is distinct in both composition and properties from both pure tungsten metal and from stoichiometric tungsten nitride and is characterized by lower stress than both of these materials. The provided nitrogen-doped tungsten layer was shown to have a polycrystalline structure. In some embodiments the film is characterized by a resistivity of between about 25-35 μOhm-cm, such as between about 25-30 μOhm-cm.

In one embodiment, the provided nitrogen-doped tungsten is deposited by flowing a process gas comprising a noble gas (e.g., argon) and $N_2$ into a PVD process chamber comprising a tungsten-containing target (e.g., a pure tungsten target or a target containing nitrogen-doped tungsten), and forming a plasma in the PVD process chamber to deposit the nitrogen-doped tungsten layer onto the layer of dielectric material. The deposition is conducted such that the partial pressure of nitrogen in the chamber drops at the time when plasma ignites (or shortly thereafter), thereby providing a more nitrogen-rich environment in the beginning of deposition, such that a more nitrogen-rich layer is formed at the interface with the dielectric. In some embodiments, the partial pressure of nitrogen may decrease upon ignition of plasma even if the flow rate of nitrogen provided to the process chamber does not change. In other embodiments, the flow rate of nitrogen is reduced during the course of deposition (e.g., at the time of plasma ignition). The use of pure tungsten metal target is preferred in many embodiments.

The concentration of $N_2$ provided into the process chamber is one of the important parameters of deposition. In some embodiments, the flow rate of $N_2$ is between about 10-17% of the total flow rate of the process gas. In some embodiments, the flow rate of nitrogen is preferably between about 12-16%, such as between about 13-14% of the total flow rate of the process gas at least in the beginning of deposition (e.g., throughout deposition). In these embodiments, the deposition rate of nitrogen-doped tungsten normalized for target power should preferably be between about 0.40-0.48 nm/kW×second, such as about 0.44 nm/kW×second, wherein kW refers to the power provided to the PVD target.

In some embodiments the process conditions for the deposition are selected for any type of apparatus in the following manner. First, a nitrogen flow rate transition region, at which the nitrogen-doped tungsten film undergoes an abrupt transition from low-resistivity film to a high resistivity film is determined for a particular set of process conditions and film thickness. Next, the desired film is deposited using the nitrogen flow rate belonging to the transition region or its vicinity, for the deposition of the layer. In some embodiments, in the beginning of the process (e.g., prior to plasma ignition) nitrogen gas is provided at a flow rate that is also within the transition region, or is 10-20% greater than the highest flow rate of the transition region. Then, the flow rate of nitrogen may be reduced to a lower flow rate from within the transition region and the bulk of the layer may be deposited. In this manner, the flow rate of nitrogen can be selected for a variety of types of PVD chambers and for different sets of conditions. In some embodiments, the transition region values of nitrogen flow are provided to the user for a pre-determined apparatus or a set of conditions.

In one embodiment, the deposition method involves providing a process gas consisting essentially of argon and nitrogen, where argon is provided at a flow rate of about 80 sccm, and nitrogen is provided at a flow rate of between about 11-14 sccm, more preferably at a flow rate of about 12 sccm.

The PVD deposition can be carried out, in some embodiments, at a temperature of between about 100-400° C., at a pressure of between about 2-5 mTorr by providing a direct current (DC) to the tungsten target acting as a cathode at a power level of between about 4-14 kW. In some embodiments deposition is carried out at a temperature of between about 250-350° C., at a pressure of between about 2-4 mTorr by providing a direct current (DC) to the tungsten target at a power level of about 10 kW to deposit the layer at a rate of about 4 nm/second. In these embodiments, the deposition rate of nitrogen-doped tungsten normalized for target power should preferably be between about 0.40-0.48 nm/kW× second, such as about 0.44 nm/kW×second, wherein kW refers to the power provided to the PVD target. Nitrogen gas is provided to the process chamber in these embodiments at a flow rate that is between about 10-17% of the total process gas flow rate, more preferably between about 12-16%, such as between about 13-14% of the total flow rate. Preferably the process gas consists of nitrogen and argon. Other noble gases, such as helium and neon can be used in addition or instead of argon in some embodiments.

In some embodiments the layer of low-stress nitrogen-doped tungsten is deposited as a stack of a plurality of sublayers. For example the deposition may involve (i) flowing a process gas comprising nitrogen and a noble gas and igniting a plasma to deposit a first sublayer of nitrogen-doped tungsten on the dielectric substrate, wherein the flow rate of nitrogen is reduced when the plasma is ignited or shortly after plasma ignition (e.g., from about 15% of the total process gas flow to about 13% of the total process gas flow); (ii) after the first sublayer is deposited, extinguishing the plasma; (iii) flowing a process gas comprising nitrogen and a noble gas and igniting a plasma to deposit a second sublayer of nitrogen-doped tungsten on the underlying sublayer of nitrogen-doped tungsten, wherein the flow rate of nitrogen is reduced when plasma is ignited or shortly after plasma ignition (e.g., from about 15% of the total process gas flow to about 13% of the total process gas flow); and (iv) repeating operations (ii) and (iii) until the nitrogen-doped layer having a thickness of at least about 300 nm is deposited. The sublayers and the multi-sublayer film generally have the same properties as described above for a single film. The deposition of the film using the stack of sublayers improves reproducibility of stress and adhesion values, in comparison to deposition of a single film.

In some implementations, provided methods are integrated into the processing scheme that includes photolithographic patterning that includes: applying photoresist to the substrate; exposing the photoresist to light; patterning the photoresist and transferring the pattern to the substrate; and selectively removing the photoresist from the substrate.

Another aspect of this invention pertains to an apparatus for processing material on a semiconductor wafer. The apparatus includes a PVD process chamber configured to hold a tungsten target for sputtering tungsten onto the semiconductor substrate, a substrate support for holding the substrate in position during deposition and a controller including instructions (e.g., program instructions, or built-in logic) for performing any of the methods provided herein. For example, the instructions may specify the flow rates of nitrogen and of the noble gas, temperature, pressure, and power level provided to the target, for depositing a low stress nitrogen-doped tungsten layer described herein. The apparatus may include for, example, a planar magnetron.

In some embodiments, a system is provided, wherein the system includes the apparatus described herein and a stepper.

In another aspect, a non-transitory computer machine-readable medium is provided, where the medium includes program instructions for a deposition apparatus containing code for performing any of the operations of the methods described herein.

These and other features and advantages of the present invention will be described in more detail below with reference to the associated drawings.

DETAILED DESCRIPTION OF PREFERRED EMBODIMENTS

Figure 1A:
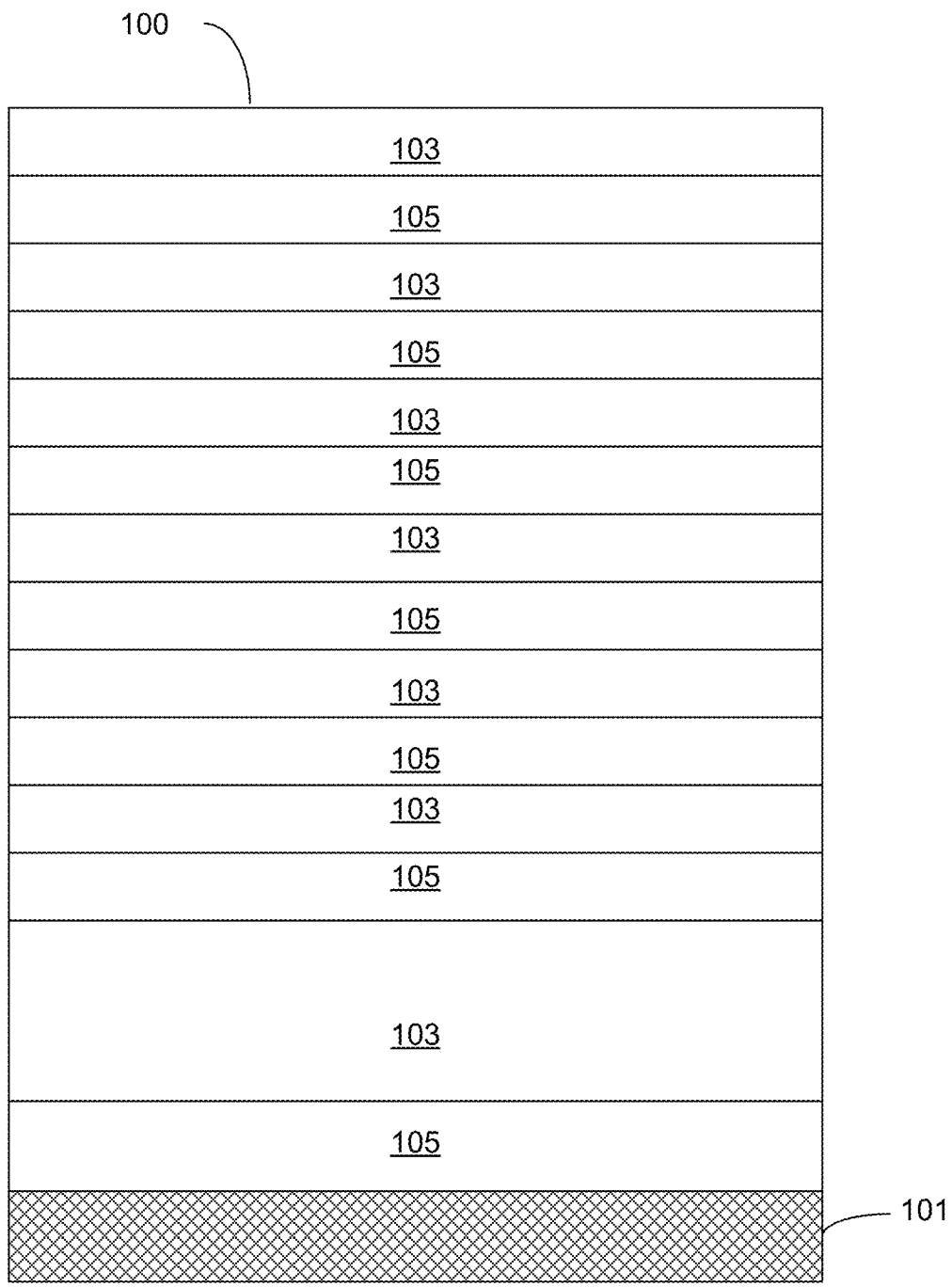
FIGS. 1A-1B show cross sectional depictions of device structures before and after deposition of a nitrogen-doped tungsten hardmask, in accordance with embodiments provided herein.

Low-stress nitrogen-doped tungsten films and methods of their deposition are provided. The films generally have a stress of less than about 250 MPa in absolute value, and, in some embodiments, have a stress of less than about 200 MPa in absolute value. Due to low stress, it is possible to deposit relatively thick films on a semiconductor substrate without causing substantial bowing of the substrate. For example, films having a thickness of greater than 300 nm, greater than 400 nm, such as between about 300-900 nm can be deposited without causing substrate bowing of greater than about 150 μm, and in some embodiments, of greater than about 50 μm. In addition, in some embodiments, provided low-stress films have an excellent adhesion to dielectric (e.g., to silicon oxide based dielectric), and can be deposited directly onto the dielectric layers without requiring an additional adhesion layer between the dielectric layer and the layer of nitrogen-doped tungsten.

The low-stress films and their methods of deposition were unexpectedly discovered, and it was found that controlled addition of small amounts of nitrogen during PVD tungsten deposition provides nitrogen-doped tungsten films that have significantly lower stress than both pure tungsten metal and stoichiometric tungsten nitride. The provided films are deposited onto the dielectric layer such that concentration of nitrogen in the film at the interface with the dielectric layer is greater (e.g., at least 20% greater, such as at least 30% greater) than elsewhere in the deposited film, and such that concentration of nitrogen anywhere in the film is relatively low (preferably between about 5-20% atomic, such as between about 5-15% atomic). In one of the preferred embodiments, the concentration of nitrogen at the interface with the dielectric layer is between about 11-13% atomic, while concentration of nitrogen in the bulk of the layer is between about 7-9% atomic.

Without wishing to be bound by a particular theory or mechanism, it is believed that the unusual reduction in stress in nitrogen-doped tungsten films of provided composition occurs due to a sharp transition in material properties occurring in the interval of nitrogen concentration of between about 7 and 13% atomic. The experimental data suggest that there is a transition between a material having a tensile stress and a material having compressive stress within this interval. Accordingly, deposition of a relatively nitrogen-rich layer (e.g., 12% atomic N) at the interface with the dielectric followed by a deposition of a relatively nitrogen-poor layer (e.g., 7% atomic N) may lead to partial or complete cancellation of stresses resulting in low total stress for the deposited film.

It is noted that negative values (e.g., −250 MPa) are conventionally ascribed to compressive stress, while positive values (e.g., 250 MPa) are conventionally ascribed to tensile stress. As used herein, the term "low stress", or a "stress lower than", refers to the absolute value of stress. For example, a film having a stress lower than 25 MPa may have a compressive or tensile stress of 10 MPa.

The composition of the nitrogen-doped tungsten film is characterized by nitrogen content. Nitrogen content in the film, as used herein including the claims, refers to atomic % value determined by SIMS.

Stress and substrate bow values are determined by the following method. A laser scanner is used to measure the changes in the radius of curvature of the substrate caused by the deposition of a thin film on the wafer. This is accomplished by first measuring the wafer curvature before the film is deposited and then re-measuring the curvature after the film is deposited. The stress of the film is calculated from these bow data.

The term "semiconductor substrate" as used herein refers to a substrate such as a wafer or a die that contains a semiconductor material anywhere in the substrate. The semiconductor substrate typically includes a number of layers of other materials, such as dielectric material layers.

The low-stress films provided herein can be used in any semiconductor substrate processing schemes, where low stress and/or good adhesion to dielectric are desired. In some embodiments the nitrogen-doped tungsten films are used in fabrication of 3D NAND memory. This application is illustrated by FIGS. 1A and 1B which illustrate one example of a substrate before and after deposition of the nitrogen-doped tungsten layer.

Figure 1B:
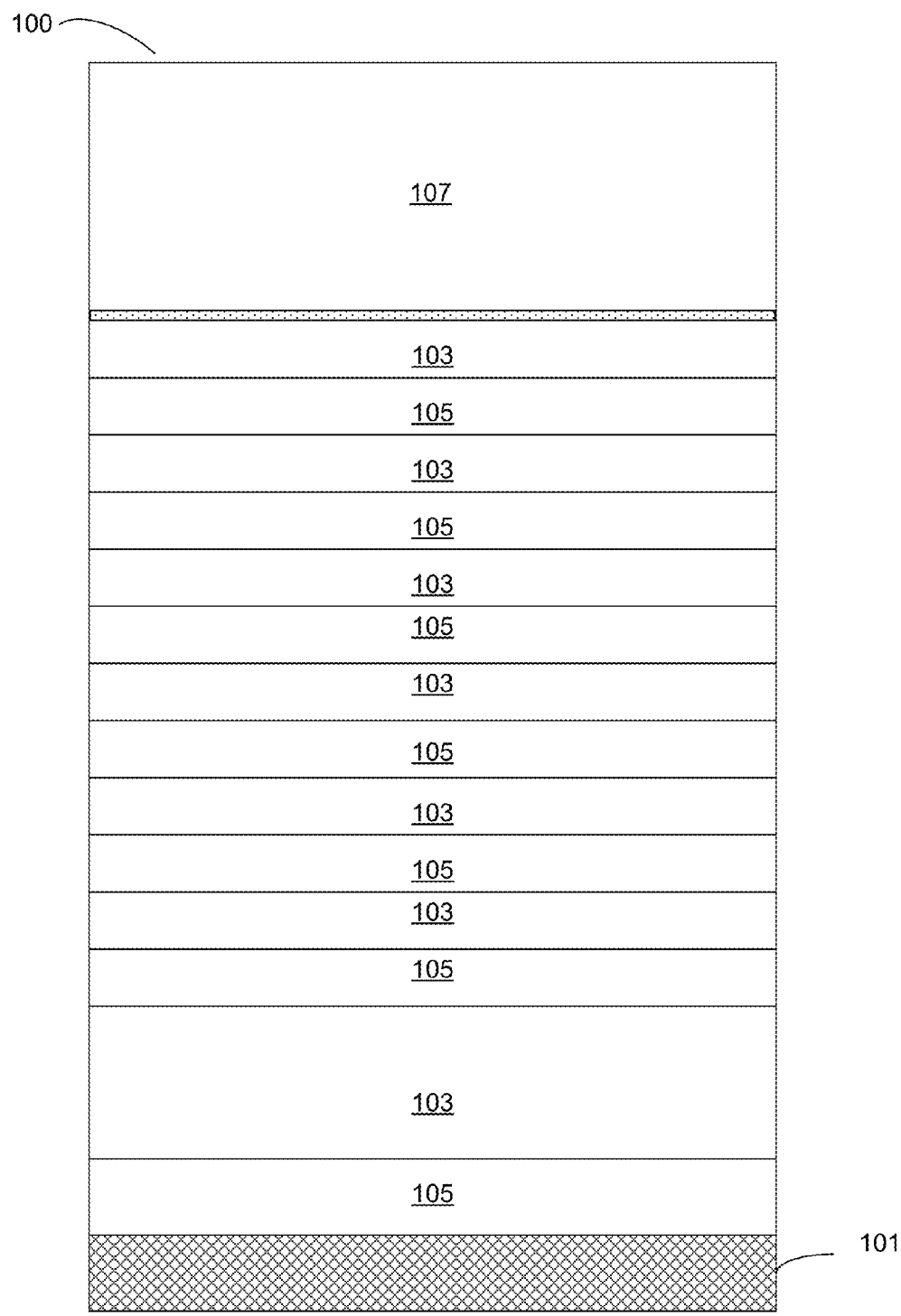

FIG. 1A provides a schematic cross-sectional view of a substrate 100 that includes a bottom substrate layer 101 (e.g., a semiconductor material), and alternating layers 103 and 105 stacked over layer 101. The alternating layers may include different dielectric materials. For example, layer 103 may be a silicon nitride layer, and layer 105 may be a silicon oxide based dielectric layer. Each of the layers in the stack can have a thickness of between about 100-1500 Å, such as between about 150-400 Å. The illustrated stack has 14 alternating layers 103 and 105. In various embodiments, the stack may have more than 10 layers, such as more than 20 layers, e.g., between about 10-100 layers that are deposited on top of each other by, for example, plasma enhanced chemical vapor deposition (PECVD) or a spin on coating method. The top exposed layer 103 is a dielectric layer. Examples of suitable dielectric materials include without limitation doped and undoped silicon oxide (e.g., silicon oxide deposited from tetraethyl orthosilicate (TEOS) precursor), doped and undoped silicon nitride, doped and undoped silicon carbide, etc. The stack shown in FIG. 1A is provided to a PVD process chamber and a layer of low-stress nitrogen-doped tungsten is deposited directly on top of the dielectric layer 103. The resulting structure is shown in FIG. 1B. The deposited nitrogen-doped tungsten layer 107 has a thickness of at least about 300 nm, such as between about 500-900 nm. As previously mentioned, the deposited nitrogen-doped tungsten layer 107 has a higher concentration of nitrogen at the interface with the dielectric layer 103 than in the bulk of the layer, and has a nitrogen concentration that is between about 5-15 atomic %.

Figure 2:
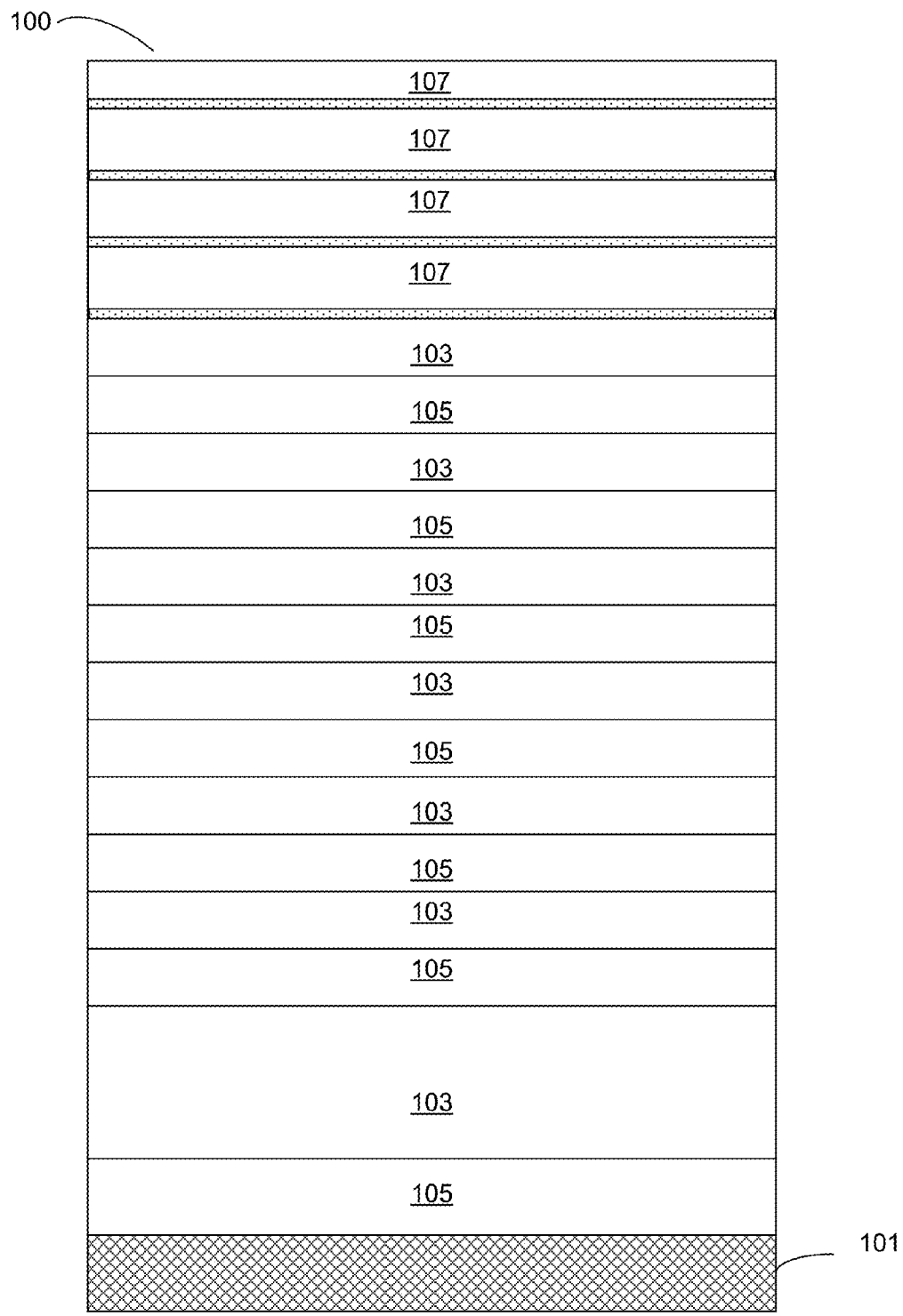
FIG. 2 is a cross-sectional depiction of a device structure after deposition of a multi-layer nitrogen-doped tungsten hardmask in accordance with an embodiment provided herein.

A nitrogen-doped tungsten film, in some embodiments, is prepared in the form of a multi-layer stack. The stack may have, for example, between about 2-12 sub-layers, such as between about 4-10 sublayers. In some embodiments, each sublayer may have a thickness of between about 50-150 nm. Each sublayer of the film includes a nitrogen-rich portion at the interface with the underlying film, where concentration of nitrogen is greater than elsewhere in the sublayer. The nitrogen content of each sublayer is the same as previously described for the single layer embodiments. An example of such multi-layer nitrogen-doped tungsten film is shown in FIG. 2, which illustrates four sublayers 107 of nitrogen-doped tungsten, wherein each sublayer has a higher concentration of nitrogen (shown as the darker region) than elsewhere in the film.

In some embodiments, the low-stress nitrogen-doped tungsten films, provided herein are used as hardmasks. In one example a substrate having a dielectric layer on its surface is provided. Such substrate may include a stack of layers and an exposed dielectric layer as the top layer of the stack, as one shown in FIG. 1A. Next, a layer of low-stress nitrogen-doped tungsten (e.g., as a single layer, or as a stack of sub-layers) is deposited onto the exposed dielectric layer to a thickness of at least about 400 nm. The deposition conditions are adjusted such that the concentration of nitrogen in the deposited layer (or in the first sublayer) is higher at the interface with the dielectric layer than elsewhere in the layer (or sublayer). The deposition conditions are also adjusted such that the concentration of nitrogen in the layer (or each sublayer) is between about 5-20% atomic, and is more preferably between about 5-15% atomic. Next, when the deposited layer is used as a hardmask, the nitrogen-doped tungsten is patterned to expose the underlying dielectric layer in a desired pattern. For example, photolithographic patterning can be employed. After patterning, the exposed dielectric layer is etched while the nitrogen-doped tungsten is not completely removed. The etching operation typically etches through a plurality of underlying dielectric layers, e.g., the dielectric layers 103 and 105 can be etched to the bottom of the stack. After etching, the nitrogen-doped tungsten film is typically removed, e.g., by chemical mechanical polishing (CMP).

Figure 3A:
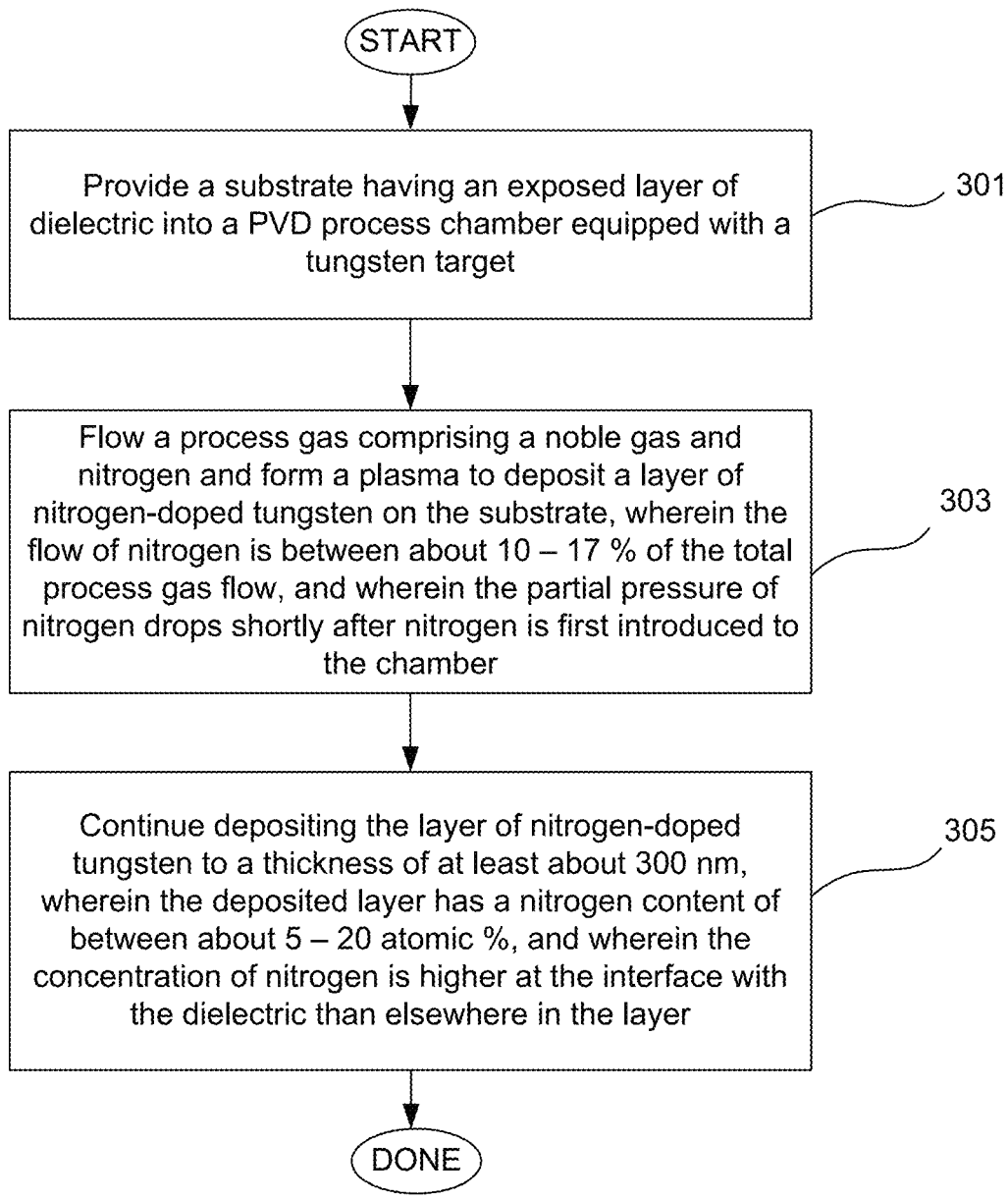
FIG. 3A is a process flow diagram for a method of depositing a low stress nitrogen-doped tungsten film in accordance with an embodiment provided herein.

An example of a suitable method for depositing a low-stress nitrogen-doped tungsten layer is provided by the process flow diagram shown in FIG. 3A. The process starts in 301 by providing a substrate having an exposed dielectric layer to a PVD process chamber equipped with a tungsten target. A process gas that includes a noble gas (e.g., argon) and $N_2$ is provided into the chamber and plasma is formed in the process chamber to deposit the low-stress nitrogen-doped tungsten layer. In the example illustrated in FIG. 3A, the low-stress layer is formed by providing $N_2$ at a flow rate of between about 10-17% of the total process gas flow, as shown in operation 303. More preferably, $N_2$ is provided at a flow rate of between about 12-16% of the total process gas flow, such as between about 11-14% of the total process gas flow. In one example the flow rate of $N_2$ is about 13% of the total process gas flow. The process is also conducted such that partial pressure of nitrogen drops during the course of deposition (such as at the time of plasma ignition or shortly thereafter).

In some embodiments, the partial pressure of nitrogen drops in the process chamber, even if the flow rate of nitrogen is kept constant throughout deposition. It is believed that in this embodiment nitrogen is quickly consumed in the process chamber (e.g., by excess tungsten sputtered onto the shields of the chamber), resulting in a drop in the partial pressure, which in turn results in a higher concentration of nitrogen in the tungsten layer at the interface with the dielectric. Thus in some embodiments, $N_2$ is provided at a constant flow rate throughout deposition where the flow rate is between about 10-17% of the total process gas flow, more preferably between about 11-14% of the total gas flow, such as about 13% of the total process gas flow.

In other embodiments the partial pressure of nitrogen may be reduced by reducing the flow rate of nitrogen. For example, the deposition process may start by initially providing nitrogen to the process chamber at a flow rate of between about 10-17% of the total process gas flow, such as between about 11-14% of the total process gas flow, and then the nitrogen flow rate may be reduced preferably within these ranges, and the process may continue to deposit the nitrogen-doped tungsten film as shown in operation 305. It is preferable not to turn off the nitrogen flow even at the end of deposition, since this can negatively affect adhesion and stress of the deposited layer.

The PVD deposition is carried out in some embodiments at a temperature of between about 100-400° C., at a pressure of between about 2-5 mTorr by providing a direct current (DC) to the tungsten target at a power level of between about 4-14 kW. In some embodiments deposition is carried out at a temperature of between about 250-350° C., at a pressure of between about 2-4 mTorr by providing a direct current (DC) to the tungsten target at a power level of about 10 kW. In these embodiments, the deposition rate of nitrogen-doped tungsten should preferably be between about 0.40-0.48 nm/kW×second, such as about 0.44 nm/kW×second, wherein kW refers to the power provided to the PVD target. Nitrogen gas is provided to the process chamber in these embodiments at a flow rate that is between about 10-17% of the total process gas flow rate, such as between about 11-14% of the total gas flow, more preferably between about 12-16%, such as between about 13-14% of the total flow rate. It is understood that the parameters provided herein are used for illustration purposes and are not limiting. One of skill in the art can use parameters that may fall outside of provided ranges to ultimately produce the film of the same composition, e.g., a film that has a higher concentration of nitrogen at an interface with dielectric and has a nitrogen concentration in the range of between about 5-15 atomic %.

Figure 3B:
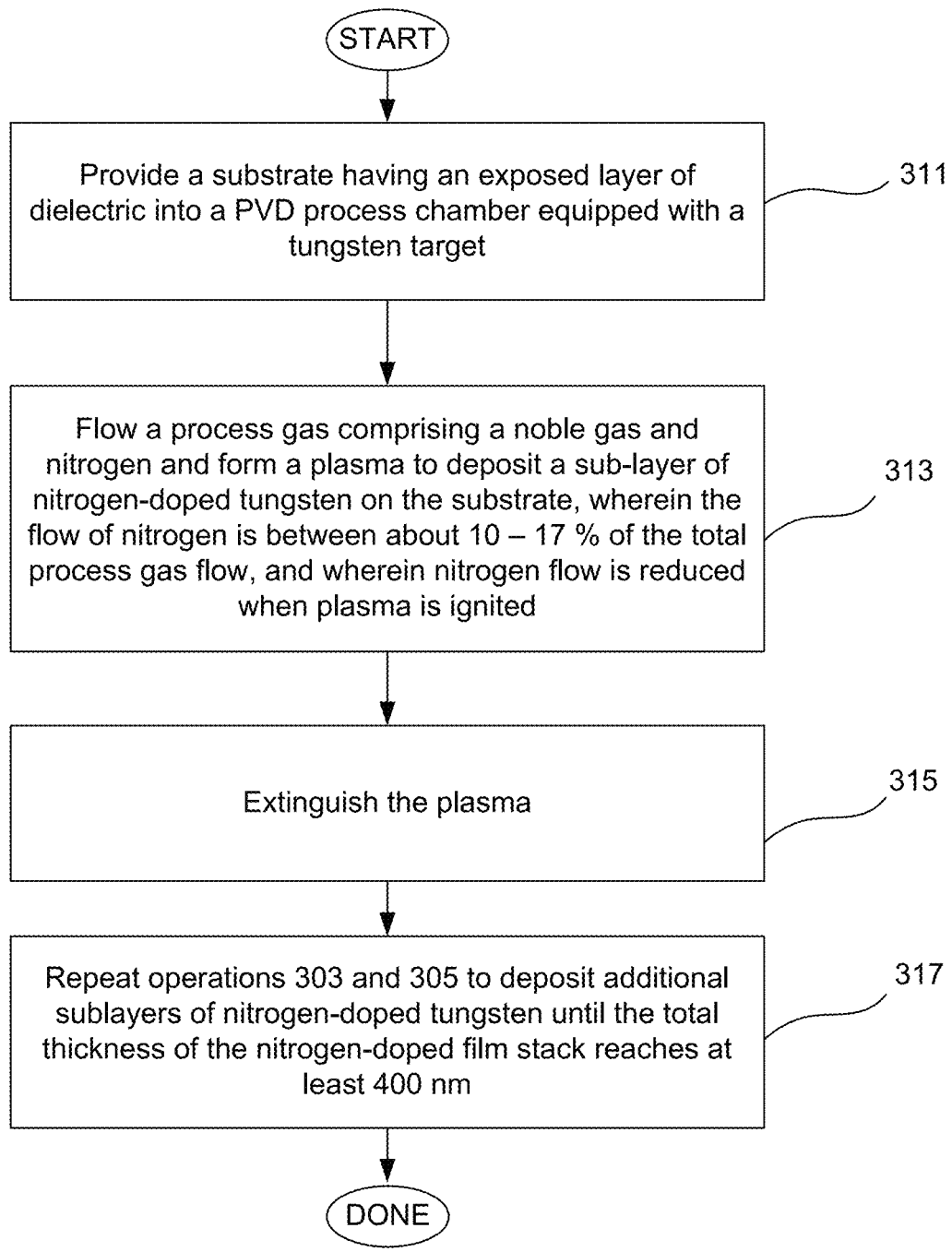
FIG. 3B is a process flow diagram for a method of depositing a multi-layer low stress nitrogen-doped tungsten film in accordance with an embodiment provided herein.

In some implementations it is preferable to deposit the layer of nitrogen-doped tungsten as a multi-layer stack. FIG. 3B illustrates a process flow diagram for depositing a multi-layer nitrogen-doped tungsten film, in accordance with some embodiments of the invention. The process starts, as previously, in 311 by providing a substrate into a PVD process chamber equipped with a tungsten target. Next, instead of continuously depositing more than 400 nm of nitrogen-doped tungsten, a plurality of thinner sublayers are deposited, wherein each sublayer is engineered to have a higher concentration of nitrogen at the interface of an underlying layer than elsewhere in the sublayer. In some embodiments this deposition is conducted by first depositing a first sublayer as shown in the operation 313. This first deposition involves flowing a noble gas and nitrogen into the PVD process chamber and forming a plasma to deposit a first sublayer of nitrogen-doped tungsten on the substrate, wherein the nitrogen flow rate is between about 10-17% of the total process gas flow rate, and wherein the flow rate of nitrogen is reduced when plasma is ignited (or shortly thereafter). In one example, the flow rate of nitrogen is reduced from about 14 sccm to about 12 sccm, when the plasma was ignited, while the flow rate of argon stayed constant at 80 sccm. The first sublayer, in some embodiments is deposited to a thickness of between about 50-150 nm. Next, in operation 315 the plasma is extinguished. Next, in operation 317, deposition of additional sublayers, is repeated until a film having a desired thickness of at least about 400 nm is formed. It is noted that process conditions for deposition of each sublayer may be the same or may differ, but the nitrogen flow should be within the guidelines provided herein.

Figure 4A:
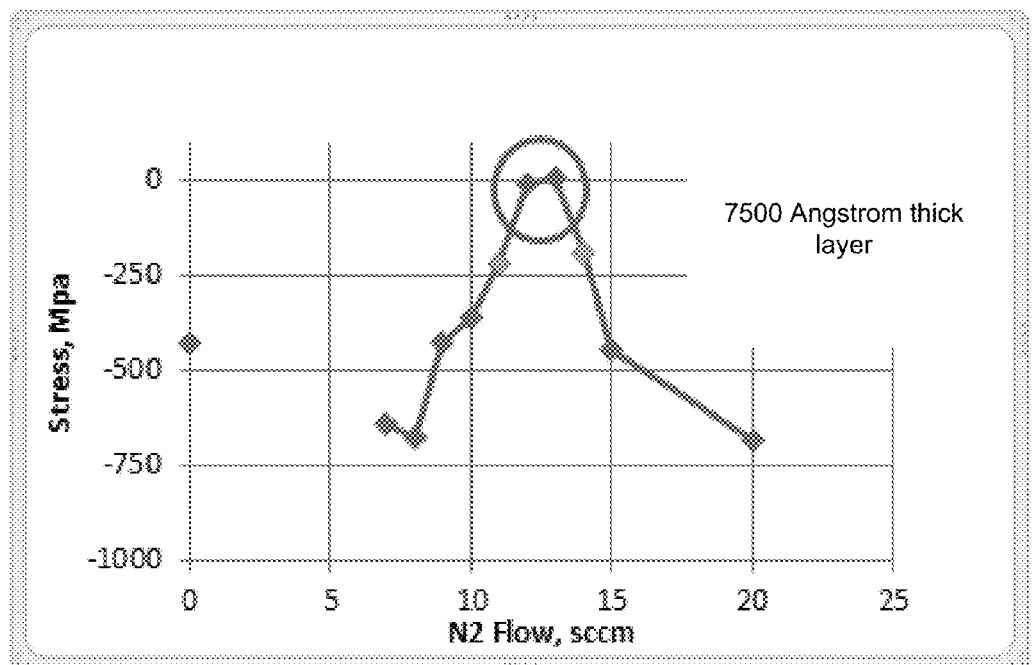
FIG. 4A is an experimental plot illustrating dependence of film stress on nitrogen flow rate.

FIG. 4A provides experimental data illustrating stress of 750 nm thick tungsten films deposited on a TEOS dielectric layer as a function of nitrogen flow rate. The films were deposited in a PVD process chamber equipped with a pure tungsten target, which was negatively biased using DC current provided at a power level of 10 kW. A process gas consisting of argon and nitrogen was provided to the process chamber for deposition of nitrogen-doped tungsten. For deposition of pure tungsten the process gas consisted of argon without added nitrogen. The flow rate of the process gas was kept constant throughout deposition. Capacitively coupled plasma was formed in the process chamber and was sustained using a planar magnetron. The films were deposited at a pressure of 2.5 mTorr, and at a temperature of 300° C. The argon flow rate was 80 sccm for all films, while $N_2$ flow rate varied for different films from 0 to 20 sccm. The films were deposited as stack of 6 sublayers, where each sublayer (about 125 nm thick) was deposited using identical conditions, and plasma was extinguished between depositions of sublayers. The flow of nitrogen was constant during deposition of each sub-layer, but during each deposition the partial pressure of nitrogen was higher in the very beginning of the deposition.

It can be seen that stress of deposited films is very high for both pure tungsten and for nitrogen-rich nitrogen-doped tungsten, but is unexpectedly and sharply reduced in a relatively narrow range of nitrogen flow rates. Specifically, stress of less than about 250 MPa was observed in films deposited with nitrogen flow rates in the range of 11-14 sccm, corresponding to between about 12-16% of nitrogen flow to the total process gas flow. Significantly, films deposited using 12-13 sccm flow of $N_2$ have stress values that are close to zero. These flow rates correspond to about 13-14% of nitrogen flow rate to total process gas flow rate.

In addition, adhesion to the underlying TEOS layer was measured for the deposited films. During the dry adhesion measurement the measurement involved scribing of the wafer substrate using a diamond pen at least at 6 locations. The locations cover center, middle radial positions and edge of the wafer. 3M scotch tape was taped over the selected areas and then was peeled off of the substrate with a relatively quick action to determine if the film was removed from the substrate. Excellent adhesion (no delamination on images) was observed for layers deposited using 12-13 sccm flow of $N_2$ (corresponding to 13-14% of the total process gas flow rate).

Figure 4B:
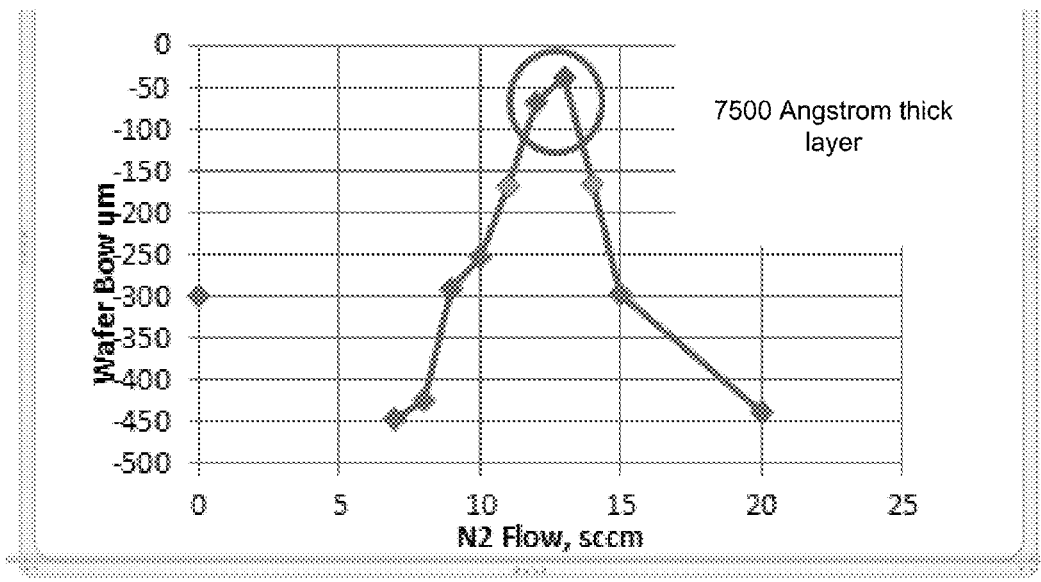
FIG. 4B is an experimental plot illustrating dependence of substrate bow on flow rate of nitrogen.

FIG. 4B illustrates experimental data for substrate bow as a function of nitrogen flow rate for 750 nm thick layers deposited under the same conditions as films illustrated in FIG. 4A. It can be seen that bow of less than about 150 μm, such as less than about 50 μm can be obtained for 750 nm thick films, which makes these films highly attractive for hardmask applications.

Figure 4C:
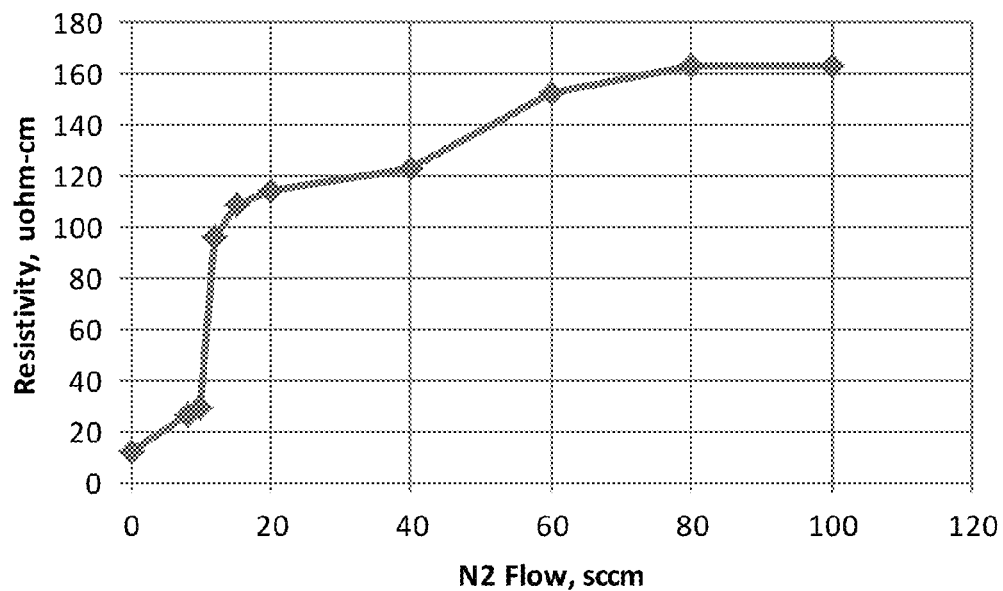
FIG. 4C is an experimental plot illustrating dependence of film resistivity on nitrogen flow rate illustrating the transition region from low-resistivity to a high-resistivity film.

FIG. 4C is an experimental plot illustrating the resistivity of a tungsten film as a function of nitrogen flow rate in the PVD system. In this experiment 100 nm thick films were deposited using different nitrogen flow rates, and resistivity was measured. It can be seen that between about the flow rates of 10 sccm and 15 sccm a sharp increase in resistivity occurs, corresponding to a transition from a less resistive more tungsten-like film to a more resistive more tungsten nitride-like film. This region of sharp increase in resistivity is referred to here as the transition region, and in some embodiments, may be used to identify the flow rates of nitrogen that are suitable for deposition of low-stress films. In some embodiments the deposition is conducted at the nitrogen flow rates that belong to the transition region or are within 10% or 20% of the flow rates that belong to the transition region. Further, it is preferable, in some embodiments, that in the beginning (e.g. prior to ignition of plasma) the nitrogen flow rate is greater than during the deposition of the rest of the film.

Figure 4D:
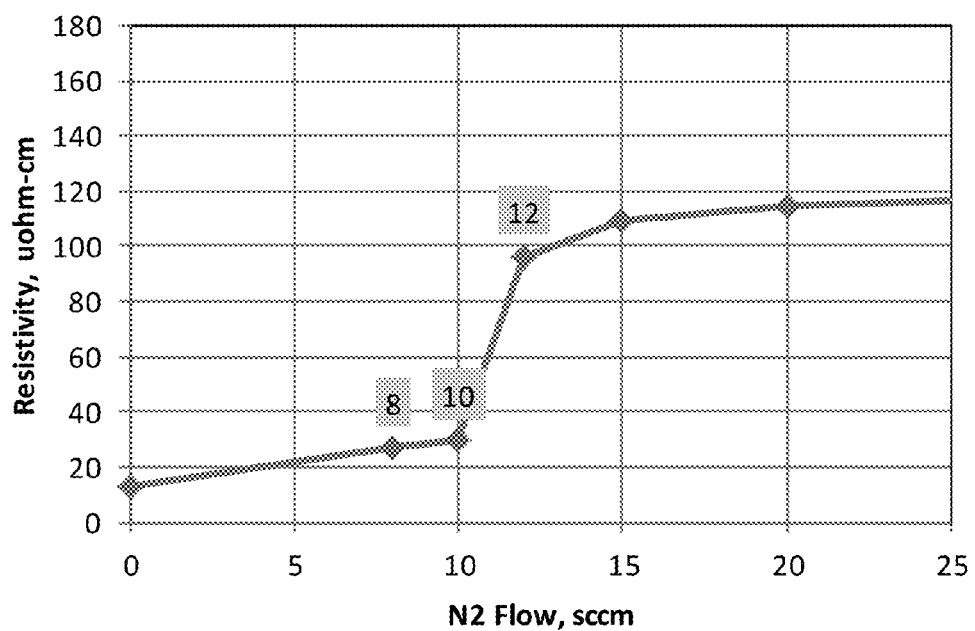
FIG. 4D is a portion of the experimental plot of FIG. 4C illustrating dependence of film resistivity on the nitrogen flow rate in the transition region.

FIG. 4D shows the enlarged portion of the graph shown in FIG. 4C and clearly shows the transition period of between about 10-15 sccm. In some embodiments, prior to plasma ignition nitrogen is provided at 14 sccm, and is then provided at 12 sccm (wherein both values are within the transition period).

Figure 4E:
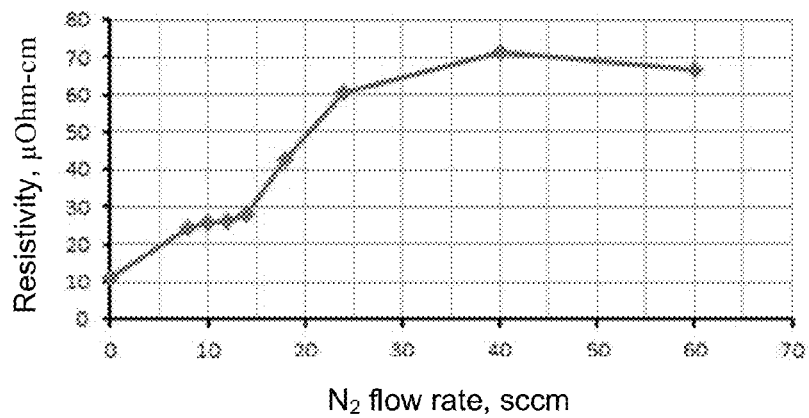
FIG. 4E is an experimental plot illustrating dependence of film resistivity on nitrogen flow rate illustrating the transition region from low-resistivity to a high-resistivity film for a 600 nm thick film.
Figure 4F:
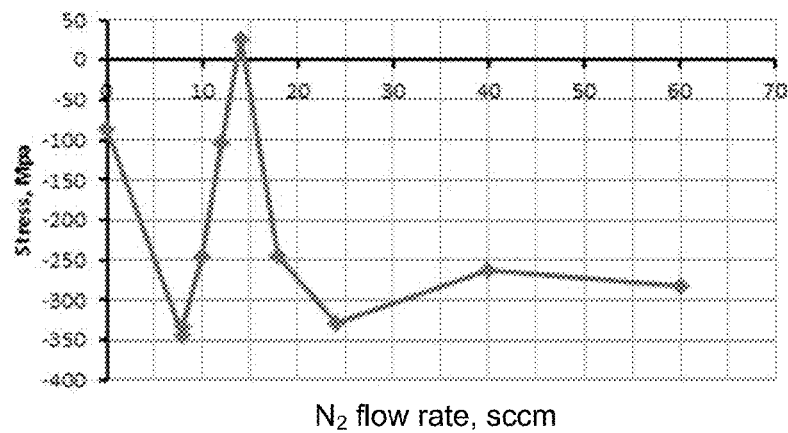
FIG. 4F is an experimental plot illustrating dependence of film stress on nitrogen flow rate for a 600 nm thick film.

FIG. 4E is an experimental plot illustrating the resistivity of a tungsten film as a function of nitrogen flow rate in the PVD system for a thicker film. In this experiment 600 nm thick films were deposited using different nitrogen flow rates, and resistivity was measured. It can be seen that between about the flow rates of 12 sccm and 24 sccm a sharp increase in resistivity occurs, corresponding to a transition from a less resistive more tungsten-like film to a more resistive more tungsten nitride-like film. This proves that the transition region is only weakly dependent on the film thickness. FIG. 4F is an experimental plot illustrating dependence of film stress for a 600 nm film on nitrogen flow rate. It can be seen that the plot is similar to that of FIG. 4A. By selecting nitrogen flow rates from the transition region or its vicinity, and preferably by providing a higher flow rate in the very beginning of deposition (e.g., before plasma ignition) than during deposition of the bulk of the layer, films with low stress and excellent adhesion can be formed.

Figure 5:
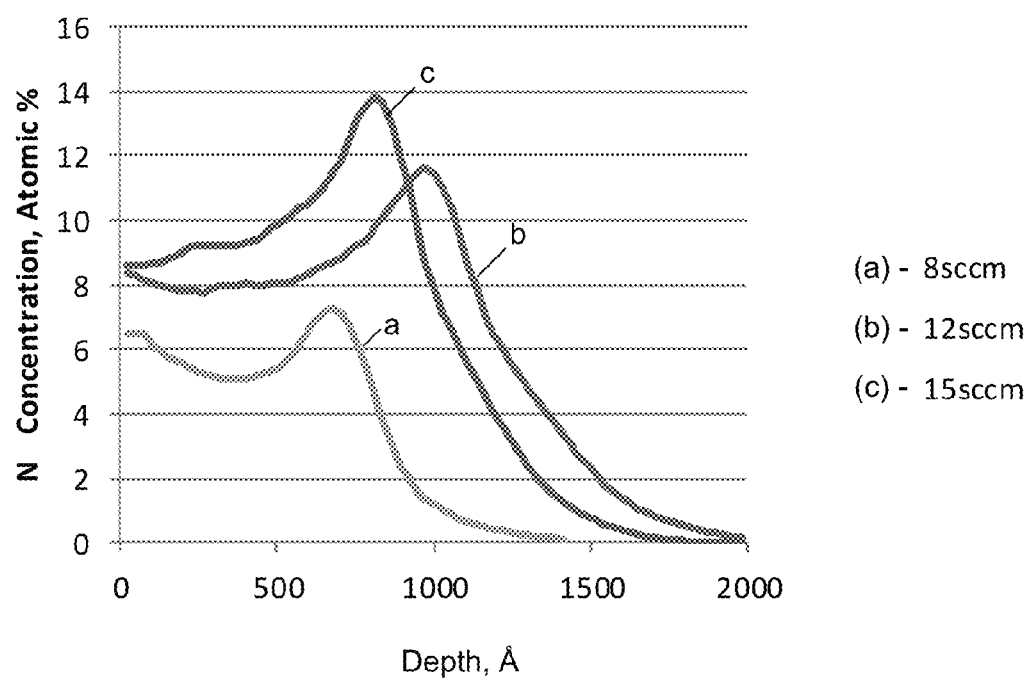
FIG. 5 is an experimental secondary ion mass spectrometry (SIMS) plot illustrating nitrogen content in films deposited using different flow rates of nitrogen.

Composition of low-stress films was experimentally studied by SIMS. Nitrogen-doped tungsten layers having a thickness of about 100 nm were deposited using different flow rates of $N_2$ (other process parameters were the same as for the films described with reference to FIG. 4A). FIG. 5 illustrates concentration of nitrogen in the film in atomic percent as a function of film depth for films deposited using 8 sccm nitrogen flow rate (curve a), 12 sccm nitrogen flow rate (curve b) and 15 sccm flow rate (curve c). It can be seen that all three films have a higher concentration of nitrogen at the interface with the dielectric layer than elsewhere in the film. The particularly preferred low-stress film was deposited using the flow rate of 12 sccm, as was discussed above. This film is characterized by nitrogen concentration of about 12 atomic % at the interface with the dielectric layer and about 8 atomic % in the bulk of the layer. These data suggest that low-stress nitrogen-doped tungsten films are characterized by a higher concentration of nitrogen at the interface with the dielectric layer, and that nitrogen concentration in the layer should be between about 5-20 atomic %, and preferably should be between about 5-15 atomic %.

Figure 6:
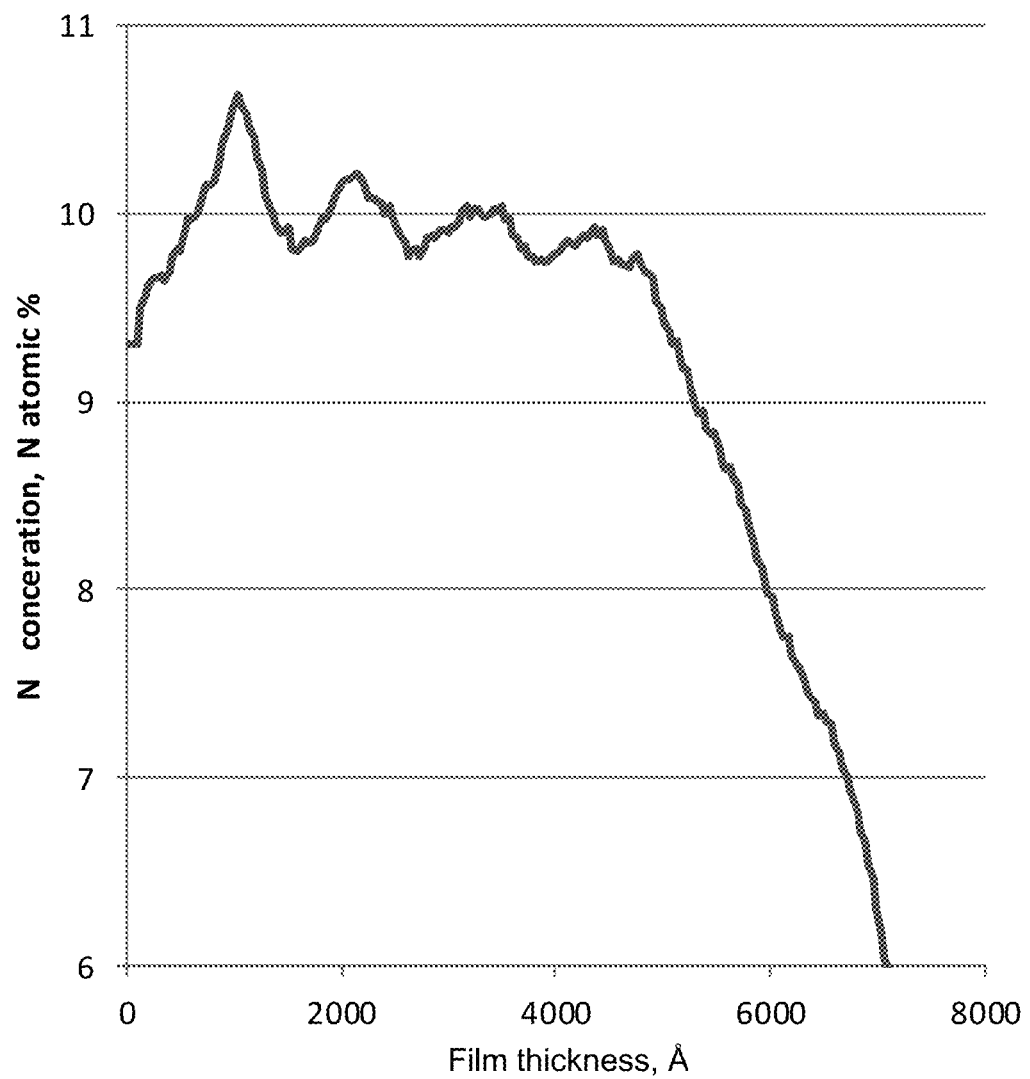
FIG. 6 is an experimental SIMS plot illustrating nitrogen content in a film containing a multi-layer stack of nitrogen-doped tungsten prepared in accordance with an embodiment provided herein.

FIG. 6 illustrates SIMS data for a 700 nm thick low-stress nitrogen-doped tungsten layer that was deposited by depositing six sublayers in a stack. It can be seen that the nitrogen content in the film is varied in a range of between about 9-11 atomic % and includes periodically repeating regions of higher and lower nitrogen concentration. Each sublayer was deposited by providing argon and nitrogen into the process chamber at flow rates of 80 sccm and 14 sccm respectively. Immediately upon ingnition of plasma the flow rate of nitrogen was reduced to 12 sccm and was kept constant throughout deposition of each sublayer. After the first sublayer was deposited, the plasma was extinguished and the second sublayer was deposited over the first sublayer using the same process conditions. The deposition of sublayers was repeated 6 times.

It is noted that the following comparative experiments were conducted for the layers that include either pure tungsten or stoichiometric tungsten nitride in combinations with the layers of nitrogen-doped tungsten, and that none of these layers provided acceptable stress and adhesion characteristics for the thicknesses exceeding 400 nm:
1. Deposition of stoichiometric WN sublayer, followed by deposition of pure W metal;
2. Deposition of nitrogen-doped tungsten sublayer, followed by deposition of pure W metal;
3. Deposition of stoichiometric WN sublayer, followed by deposition of nitrogen-doped tungsten sublayer Apparatus A variety of PVD process chambers can be used for depositing low-stress nitrogen-doped tungsten layers provided herein. For example PVD process chambers that include a planar magnetron can be used. Deposition can be conducted in apparatuses configured for using capacitively coupled plasma or inductively coupled plasma. In some embodiments, an INOVA™ apparatus (available from Lam Research, Inc. of Fremont, Calif.) that includes a planar magnetron can be used.

Figure 7:
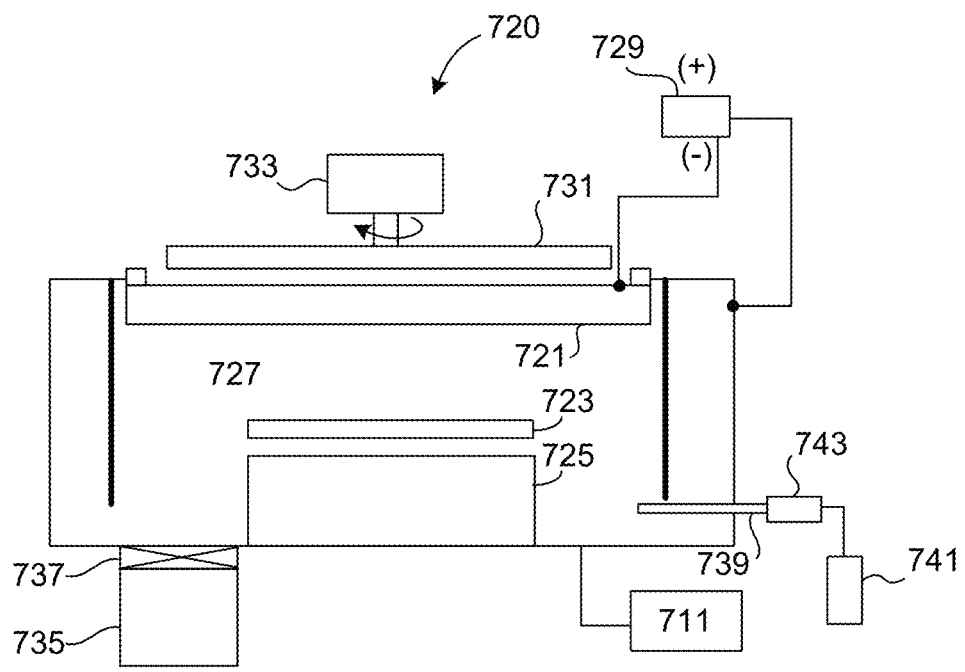
FIG. 7 is a cross sectional depiction of a planar magnetron apparatus suitable for practicing methods described herein.

FIG. 7 shows a schematic representation of an example of a planar magnetron 720 suitable for deposition of nitrogen-doped tungsten. Tungsten target 721, a circular, planar block of tungsten metal, is spaced from the wafer 723, which is mounted on a heating stage 725 in chamber 727. A DC power supply 729 is used to apply a DC field to target 721, establishing a plasma in the chamber below target 721. A circular magnet 731 mounted above the target is rotated by motor 733 setting up a magnetic field extending through target 721 into the region between the target 721 and wafer 723. Cryopump 735 connected to chamber 727 via valve 737 is used to evacuate the chamber. Process gas injector 739 is connected to process gas supply 741 via mass flow controller 743. A sputtering gas is introduced into chamber 727 via injectors 739. It is understood that the structure of module 720 is exemplary only. The methods of present invention may be practiced in other types of planar magnetrons, such as ones having ICP sources. It is noted that the methods of present invention do not require the presence of an RF-biased coil within the apparatus, although they can be practiced in an apparatus equipped with such coil. In other embodiments an electromagnetic coil or coils rather than a rotating magnet 731 can be used to maintain the plasma. The apparatus will also typically include a controller 711 electrically connected to the apparatus and containing a set of program instructions or built-in logic for executing any of the described deposition processes.

In certain embodiments, the system controller 711 is employed to control process conditions during deposition, insert and remove wafers, etc. The controller will typically include one or more memory devices and one or more processors. The processor may include a CPU or computer, analog and/or digital input/output connections, stepper motor controller boards, etc.

In certain embodiments, the controller controls all of the activities of the deposition apparatus. The system controller executes system control software including sets of instructions for controlling the timing, mixture of gases, flow rates of nitrogen and argon, chamber pressure, chamber temperature, wafer temperature, DC power levels at the target, wafer chuck or susceptor position, and other parameters of a particular process. Other computer programs stored on memory devices associated with the controller may be employed in some embodiments.

Typically there will be a user interface associated with controller 711. The user interface may include a display screen, graphical software displays of the apparatus and/or process conditions, and user input devices such as pointing devices, keyboards, touch screens, microphones, etc.

The computer program code for controlling the deposition and resputtering processes can be written in any conventional computer readable programming language: for example, assembly language, C, C++, Pascal, Fortran or others. Compiled object code or script is executed by the processor to perform the tasks identified in the program.

The controller parameters relate to process conditions such as, for example, flow rates of nitrogen and argon, magnetic field within the chamber, plasma density within the chamber, temperature, and pressure. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition and/or resputtering include mass flow controllers, pressure sensors such as manometers, and thermocouples located in pedestal or chuck. Appropriately programmed feedback and control algorithms may be used with data from these sensors to maintain desired process conditions.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

What is claimed is:

1. A method of forming a hardmask layer of low-stress nitrogen-doped tungsten on a semiconductor substrate, the method comprising:
   (a) providing the semiconductor substrate, wherein the semiconductor substrate comprises a stack of layers and has an exposed layer of a dielectric material; and
   (b) flowing a process gas comprising a noble gas and $N_2$ into a PVD process chamber comprising a tungsten-containing target, and forming a plasma in the PVD process chamber to deposit the hardmask layer of low-stress nitrogen-doped tungsten to a thickness of at least 300 nm onto the exposed layer of the dielectric material, wherein depositing the hardmask layer of low-stress nitrogen-doped tungsten comprises reducing the flow rate of $N_2$ from about 15% of a process gas flow rate to about 13% of the process gas flow rate, wherein the deposited hardmask layer of low-stress nitrogen-doped tungsten has a nitrogen content of between about 11-13 atomic % at an interface with the layer of the dielectric material and a nitrogen content of between about 6-9 atomic % in a bulk of the deposited hardmask layer of low-stress nitrogen-doped tungsten, and wherein a nitrogen content throughout the entire deposited layer of low-stress nitrogen-doped tungsten is between about 5-20 atomic %.

2. The method of claim 1, wherein the nitrogen content throughout the entire deposited hardmask layer of low-stress nitrogen-doped tungsten is between about 5-15 atomic %.

3. The method of claim 1, wherein the hardmask layer of low-stress nitrogen-doped tungsten has a stress of less than about 250 MPa in absolute value.

4. The method of claim 1, wherein the hardmask layer of low-stress nitrogen-doped tungsten has a resistivity of between about 25-35 µOhm-cm.

5. The method of claim 1, wherein a bow of the semiconductor substrate after deposition of the low-stress nitrogen-doped tungsten hardmask layer is less than about 50 µm.

6. The method of claim 1, wherein the thickness of the deposited low-stress nitrogen-doped tungsten hardmask layer is between about 500-900 nm.

7. The method of claim 1, wherein the noble gas is argon, and wherein the argon is supplied at a flow rate of about 80 sccm and $N_2$ is supplied at a flow rate of between about 11-14 sccm.

8. The method of claim 1, wherein the low-stress nitrogen-doped tungsten hardmask layer is deposited at a temperature of between about 100-400° C., pressure of between about 2-5 mTorr, and using a DC power of between about 4-14 kW provided to the tungsten-containing target.

9. The method of claim 1, wherein the low-stress nitrogen-doped tungsten hardmask layer is deposited at a temperature of between about 250-350° C., pressure of between about 2-4 mTorr, and using a DC power of about 10 kW provided to a tungsten-containing target.

10. The method of claim 1, further comprising:
   applying photoresist to the semiconductor substrate;
   exposing the photoresist to light;
   patterning the photoresist and transferring a pattern to the semiconductor substrate;
   and selectively removing the photoresist from the semiconductor substrate.

11. A method of forming a hardmask layer of low-stress nitrogen-doped tungsten on a semiconductor substrate, the method comprising:
   (a) providing the semiconductor substrate, wherein the semiconductor substrate comprises a stack of layers and has an exposed layer of a dielectric material; and
   (b) depositing the hardmask layer of low-stress nitrogen-doped tungsten having a thickness of at least 300 nm onto the exposed layer of the dielectric material by physical vapor deposition (PVD), wherein the deposited layer of low-stress nitrogen-doped tungsten comprises a plurality of sublayers, and wherein each sublayer has a nitrogen content of between about 11-13 atomic % at an interface with an underlying layer and a nitrogen content of between about 6-9 atomic % in a bulk of the sublayer, wherein a nitrogen content throughout the entire deposited hardmask layer of low-stress nitrogen-doped tungsten is between about 5-20 atomic %, and wherein depositing each sublayer comprises flowing a process gas comprising a noble gas and $N_2$ into a PVD process chamber comprising a tungsten-containing target, and forming a plasma in the PVD process chamber and reducing the flow rate of $N_2$ from about 15% of a process gas flow rate to about 13% of the process gas flow rate.

12. The method of claim 11, wherein depositing the low-stress nitrogen-doped tungsten hardmask layer comprises:
   (i) flowing the process gas comprising nitrogen and the noble gas into a PVD process chamber having a tungsten-containing target and igniting a plasma to deposit a first sublayer of nitrogen-doped tungsten onto the exposed layer of the dielectric material, wherein the flow rate of nitrogen is reduced when the plasma is ignited or shortly after plasma ignition;
   (ii) after the first sublayer is deposited, extinguishing the plasma;
   (iii) flowing the process gas comprising nitrogen and the noble gas and igniting a plasma to deposit a second sublayer of nitrogen-doped tungsten on the underlying first sublayer of nitrogen-doped tungsten, wherein the flow rate of nitrogen is reduced when plasma is ignited or shortly after plasma ignition; and
   (iv) repeating operations (ii)-(iii) until the low-stress nitrogen-doped tungsten hardmask layer having a thickness of at least about 300 nm is deposited.

13. The method of claim 12, wherein each sublayer has a thickness of between about 50-150 nm.

14. The method of claim 12, wherein the noble gas is argon, and wherein the argon is supplied at a flow rate of about 80 sccm and $N_2$ is supplied at a flow rate of between about 11-14 sccm.

15. The method of claim 11, wherein the low-stress nitrogen-doped tungsten hardmask layer is deposited at a temperature of between about 100-400° C., pressure of between about 2-5 mTorr, and using a DC power of between about 4-14 kW provided to a tungsten-containing target.

* * * * *